PULSE CONVERTER USING STRIP LINE DIRECTIONAL COUPLERS

Filed Jan. 19, 1965

INVENTOR.
RONALD G. SHORT

BY Sughrue, Rothwell, Mion, Zinn & Macpeak
ATTORNEYS.

United States Patent Office 3,418,654

Patented Dec. 24, 1968

3,418,654

PULSE CONVERTER USING STRIP LINE DIRECTIONAL COUPLERS

Ronald G. Short, Poughkeepsie, N.Y., assignor to International Business Machines Corporation, Armonk, N.Y., a corporation of New York Filed Jan. 19, 1965, Ser. No. 426,494
3 Claims. (Cl. 340—347)

ABSTRACT OF THE DISCLOSURE

A parallel to serial pulse code converter at a sending station consists of a plurality of oppositely oriented strip line directional couplers spaced along the length of a strip delay line. The couplers oriented in one direction are coupled to a first set of gating circuits. The couplers oriented in the other direction are connected to a second set of gating circuit. Information signals are applied in parallel to both sets of gating circuits. A timing pulse applied to one end of the delay line will sequentially open the gates in the first set to convert the parallel signals to series signals and direct them to a first receiving station. A timing signal applied to the other end of the delay line will sequentially gate the second set of gating circuits to convert the parallel signals to series signals and direct them to a second receiving station. Each receiving station contains a series to parallel code converter comprising a strip delay line coupled by strip line directional couplers to a plurality of gating circuits. A timing pulse derived from the series pulses sequentially opens the gating circuits so that the pulses appear in parallel on the outputs of the gating circuits.

This invention relates broadly to improved apparatus for converting pulse-coded information between serial and parallel modes and, more particularly, to a pulse converter incorporating a high frequency transmission delay line and strip line directional couplers for performing the conversion between serial and parallel modes.

A broad object of this invention is to provide an improved high frequency delay line pulse code converter which permits a timing signal, in the form of a pulse wave front or a relatively wide pulse, to control the distribution of very narrow pulses occurring at a very high repetition rate.

Another object is to provide a delay line pulse converter with spaced strip line directional couplers which sequentially couple a timing pulse front traveling in the delay line to gating circuits which open sequentially to pass coded pulses applied thereto.

Another object is to provide a delay line pulse distributor employing strip line couplers spaced along the line and designed such that the delay line exhibits substantially constant impedance along its length, thereby eliminating deterioration or distortion of a timing pulse passing the couplers as it travels in the delay line.

A more specific object of the invention is to provide a delay line pulse code converter employing strip line directional couplers spaced along the length of the line, the couplers functioning to derive from a single pulse front traveling in the delay line a plurality of time spaced pulses, the width of each pulse being determined by the length of the strip line coupler from which it is derived, and the repetition rate of the pulses being determined by the spacing between the couplers.

Another broad object is to provide a delay line pulse code converter employing complementary pairs of transmission line couplers disposed along the length of the delay line, one coupler in each pair being directionally oriented to couple to a utilization means only a timing pulse traveling in one direction through the delay line and the other coupler being oppositely oriented to couple only a timing pulse traveling through the delay line in the opposite direction.

Briefly, the foregoing objects are accomplished in a preferred embodiment of this invention by the provision of a parallel-to-serial pulse converter at a sending station. This converter employs a strip delay line with a plurality of complementary pairs of strip line directional couplers spaced along the length of the delay line and electrically coupled thereto. One coupler in each pair is connected to a corresponding one of a first set of AND circuits, and the other coupler in each pair to a corresponding one of a second set of AND circuits. The output of each stage of a bit storage register is connected to a different pair of AND circuits, thereby effectively applying parallel coded bit pulses to the AND circuits. A timing pulse front applied to one end of the delay line will be coupled only by one coupler of each pair as a gating pulse sequentially to gate open the first set of AND circuits to pass serially coded pulses to a first destination. A timing pulse front applied to the other end of the delay line will be coupled only by the other coupler in each pair as a gating pulse sequentially to open the second set of AND circuits to pass serially coded pulses to a second destination. Therefore, only one delay line is required for two destinations, and the destination is selected by the direction in which the timing pulse front travels along the delay line.

At each destination, there is provided a serial-to-parallel converter employing a strip delay line and a plurality of strip line couplers spaced along the line. Only one set of couplers is required since a pulse front traveling in only one direction is required at each destination, and the couplers are properly oriented to couple the front. The serially coded pulses are applied to a plurality of AND circuits each of which is connected to a different one of the couplers. The first received pulse acts as a timing pulse to drive a pulse front down the delay line and sequentially couple gating pulses to the AND circuits so that each received bit pulse appears as an output pulse from a different one of the AND circuits. The output of each AND circuit is connected to a different stage of a register which then stores the bit pulses in parallel mode as they originally appeared at the sending station.

The width of each coupled gating pulse is independent of the width of the pulse in the delay line and is determined only by the length of the strip line coupler. The repetition rate of the coupled gating pulses is determined by the spacing between couplers. The width of the delay line opposite each coupler is reduced so that the traveling timing pulse sees substantially constant impedance, thereby eliminating or greatly reducing deterioration of the traveling pulse front.

Other objects of the invention will be pointed out in the following description and claims and illustrated in the accompanying drawings, which disclose, by way of example, the principle of the invention and the best mode which has been contemplated of applying that principle.

Figures 1, 2:
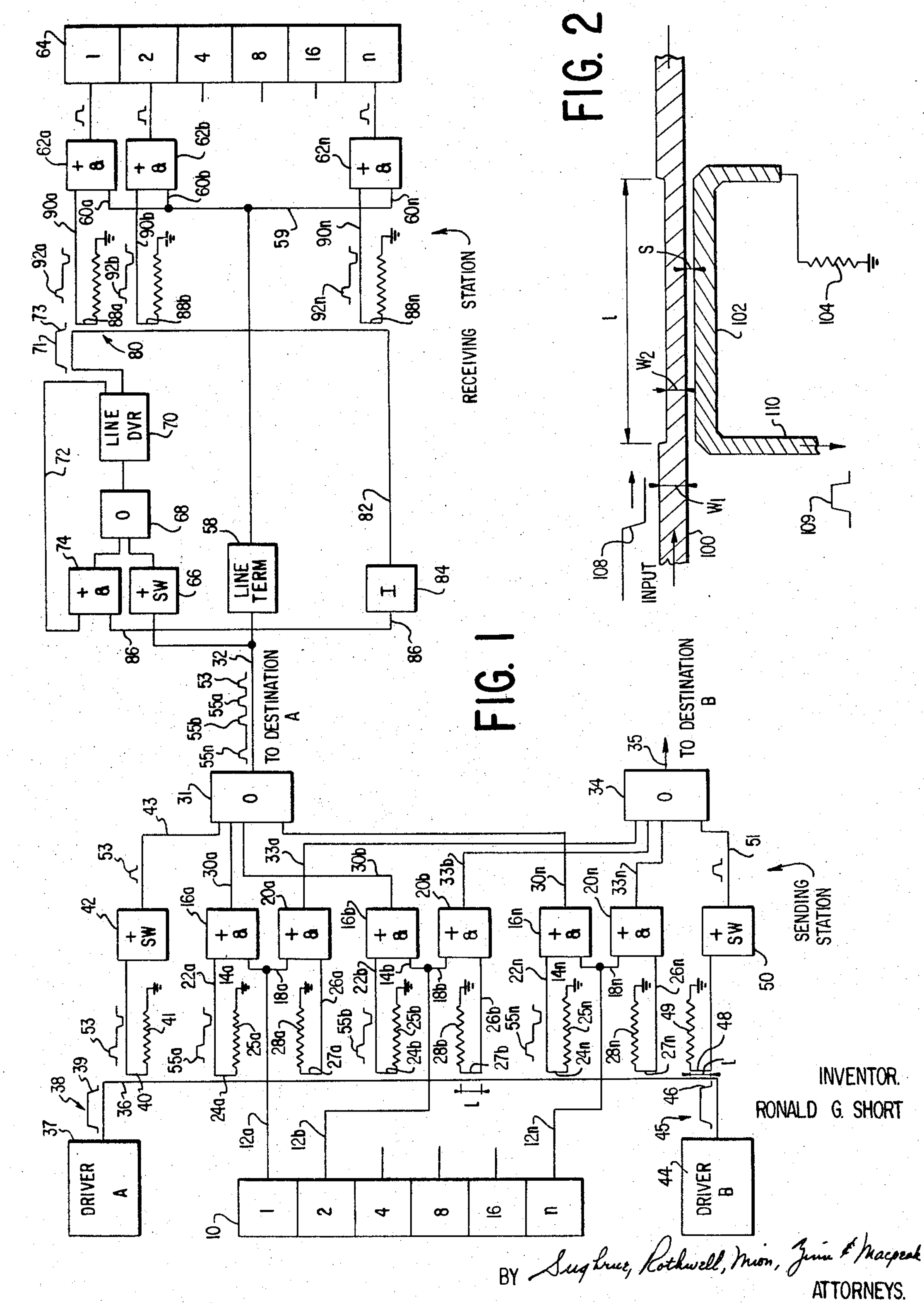
FIGURE 1 is a block diagram of a pulse transmission system employing both parallel-to-serial and serial-to-parallel pulse converters incorporating strip line directional couplers.
FIGURE 2 is an enlarged view of a strip line directional coupler of the type used in the system of FIGURE 1.

In the preferred embodiment shown in FIGURE 1, binary coded information at a sending station is stored in parallel mode in an output register 10 having $n$ stages. Connected to the respective outputs of the stages of register 10 are conductors 12, 12$b$ . . . 12$n$ each of which is also connected to the lower input 14 of a corresponding one of two input monopolar positive AND gates 16 which will produce an output only when both inputs are positive. Each of the conductors 12 is also connected to the upper input 18 of a corresponding one of monopolar positive AND gates 20. Each register stage storing an information bit applies a positive potential or pulse to its associated conductor 12.

The upper input 22 of each AND gate 16 is connected to a corresponding one of strip line directional couplers 24 each of which is terminated at its lower end with a 50-ohm resistor 25. The drawing schematically represents the center plane of a conventional strip line structure having three planes; the two outer ground planes are not shown in the drawing. The lower input 26 of each AND gate 20 is connected to a corresponding one of strip line directional couplers 27 each of which is terminated at its upper end with a 50-ohm resistor 28. These strip line couplers are shown in more detail in FIGURE 2 but in essence are conductor strips plated on a suitable substrate.

The output 30 of each AND gate 16 is connected to an OR circuit 31 whose output is connected to a transmission line 32 which extends to Destination A. The output 33 of each AND gate 20 is connected to an OR circuit 34 whose output is connected to a transmission line 35 which extends to Destination B.

The coded bits stored in register 10 may be read out by any suitable means in the form of parallel coded positive pulses which are converted to a train of serial pulses which is selectively directed to Destination A or Destination B by means of a 50-ohm high frequency transmission delay line 36 in cooperation with strip line directional couplers 24 and 27. A Destination A driver 37 may be actuated to apply to the top of delay line 36 a timing pulse 38 which travels down the delay line.

As the front 39 of pulse 38 travels down delay line 36, it first couples energy to another strip line directional coupler 40 which is oriented like couplers 24; i.e., its lower end is terminated in a 50-ohm resistor 41. The upper end of coupler 40 is connected to a suitable monopolar electronic switch 42, such as a properly poled diode, which passes only positive pulses from coupler 40 via conductor 43 to the input of OR circuit 31.

In like manner, a Destination B driver 44 may be actuated to apply to the bottom of delay line 36 a timing pulse 45 whose front 46 travels up delay line 36. Front 46 first passes another strip line directional coupler 48 which is oriented like couplers 27; i.e., its upper end is teminated in a 50-ohm resistor 49. The lower end of coupler 48 is connected to the input of another monopolar switch 50 which passes only positive pulses via a conductor 51 to the input of OR circuit 34.

The manner in which the code is converted from parallel to serial mode at the sending station will now be described. Let us assume that the contents of output register 10 are to be sent to Destination A. Therefore, driver 37 is actuated to apply timing pulse 38 to the top of delay line 36. Pulse 38 may be very wide since only the front 39 is required to generate a pulse in a properly oriented strip line coupler. The width or time duration of the pulse coupled by a strip line coupler is determined essentially by the length $l$ of the line and may be expressed as $2(l/v)$ where $v$ is the velocity of propagation in delay line 36.

A coupled pulse will appear at the outputs of only the directional couplers which are properly oriented with respect to the direction of travel of the timing pulse in delay line 36. For example, since pulse front 39 travels down delay line 36, only coupler 40 and couplers 24_a_, _b_ . . . _n_ will couple a pulse to their respective outputs. Pulse front 39 passes the unterminated upper end of each of these couplers first and, consequently, the transferred energy appears as a pulse at the coupler output. However, front 39 passes the terminated ends of coupler 48 and couplers 27_a_, _b_ . . . _n_ first and, therefore, the energy transferred from pulse front 39 is dissipated in the terminating resistors 49, 28_a_, _b_ . . . _n_, respectively. Consequently, no pulse is coupled to the outputs of these couplers.

As pulse front 39 passes coupler 40, a positive pulse 53 is coupled through monopolar switch 42 via conductor 43 and OR circuit 31 to the Destination A transmission line 32. Pulse 53 appears as the first pulse in the serial pulse train which is derived from the parallel coded information stored in register 10. Pulse 53 functions as a timing bit pulse for use in the serial-to-parallel code converter in the receiving station at Destination A.

As pulse front 39 travels down delay line 36, positive pulses 55_a_, _b_ . . . _n_ are coupled by couplers 24 to the inputs 22 of AND gates 16. If the other input 14 of an AND gate 16 carries a positive potential, the gate is conditioned to pass a pulse 55 when it appears on the other input 22. An input 14 carries a positive potential when it is connected via a conductor 12 to a register stage storing a bit. FIGURE 1, stages "1," "2" and "_n_" of register 10 are assumed to be applying positive potentials to conductors 12_a_, 12_b_ . . . 12_n_, respectively. Consequently, pulses 55_a_, 55_b_ and 55_n_ will pass through their corresponding AND gates 16 and appear as a serial pulse train on transmission line 32.

Since the pulse width of each pulse 55 is determined by the length of its corresponding strip line coupler, the width of the transmitted pulse 55 may be controlled merely by choosing the proper length of the strip line coupler. Furthermore, the repetition rate of pulses 55 is determined by the time required for pulse front 39 to travel from the lower terminated end of each of couplers 40 and 24 to the top of the next coupler. Therefore, the pulse repetition rate may be varied by varying the spacing between the couplers along the length of delay line 36.

It has been explained above that no pulses will be coupled to directional couplers 27 and 48 since these couplers are not properly oriented with respect to the traveling pulse front 39.

If it is desired to send the information in register 10 to Destination B, then driver 44 is actuated to produce pulse 45 having a front 46 which travels up delay line 36 to couple through directional couplers 48 and 27 positive pulses which pass through the AND gates 20 which correspond to stored bits in register 10. The resulting serial pulse train would then be transmitted via line 35 to a receiving station at Destination B. In this case, coupled pulses would not appear at the outputs of directional couplers 40 and 24.

As the rear or trailing edge of each of the timing pulses 38 and 45 passes a directional coupler which is properly oriented to produce a coupled pulse, a negative pulse will be coupled. However, since switches 42 and 50 and AND gates 16 and 20 are monopolar, these negative coupled pulses are ineffective.

Only the receiving station at Destination A is shown in FIGURE 1, but an identical receiving station would be located at Destination B.

The serial pulse train comprising pulses 53, 55_a_, _b_ . . . _n_ is applied through a line terminator 58 to a conductor 59 which is connected in parallel to all of the inputs 60_a_, _b_ . . . _n_ of a plurality of two-input monopolar positive AND gates 62_a_, _b_ . . . _n_ each of whose outputs is connected to a corresponding stage "1," "2" . . . "_n_" of an input register 64. Line terminator 58 functions to match the receiving station impedance to the impedance of line 32 and also amplifies the incoming pulses.

The timing pulse 53 is applied through a suitable monopolar switch 66, such as a properly poled diode, and through an OR circuit 68 to set or energize a line driver 70 which produces a positive pulse 71 at its output. Driver 70 is latched in its energized condition by means of a feedback loop including a conductor 72, a two-input monopolar positive AND gate 74 and OR circuit 68.

The output of driver 70 is connected to the upper end of a 50-ohm high frequency transmission delay line 80 whose lower end is connected to the input line 82 of an inverter 84. Inverter 84 functions to produce a positive potential on its output line 86 when there is no positive potential at its input. Consequently, inverter 84 normally applies a positive potential via line 86 to the lower input of AND gate 74. When driver 70 is set by timing pulse 53, the positive driver output pulse is fed back via conductor 72 to the upper input of AND gate 74, thereby producing a continuous positive potential at the input of driver 70 to maintain the driver in its energized condition.

The front 73 of timing pulse 71 travels down delay line 80 past a plurality of strip line directional couplers 88*a*, *b* . . . *n* which are properly oriented to transfer energy from the traveling pulse front to produce at their outputs 90*a*, *b* . . . *n* coupled positive pulses 92*a*, *b* . . . *n*. The lower end of each directional coupler 88 is terminated in a 50-ohm resistor.

The length of each strip line coupler 88 is chosen to provide a coupled pulse 92 of the desired pulse width. The spacing between the output of driver 70 and the point on delay line 80 opposite the top of strip line coupler 88*a* is chosen to produce a delay equal to the time interval between timing pulse 53 and the first information pulse 55*a*. The couplers 88*a*, *b* . . . *n* are spaced to correspond to the pulse repetition rate of the train of pulses 55*a*, *b* . . . *n*.

As the pulse front 73 travels down delay line 80, pulses 92 are sequentially coupled to the inputs 90 of AND gates 62. Consequently, pulse 55*a* will be passed through AND gate 62*a*, pulse 55*b* through AND gate 62*b*, and pulse 55*n* through AND gate 62*n*. The pulses passed through AND gates 62 are fed to corresponding stages of input register 64, thereby completing the reconversion of the serially coded pulse train to a parallel code.

When the pulse front 73 reaches the input of inverter 84, the inverter output switches from a positive to a negative potential and applies a negative pulse via line 86 to the lower input of AND gate 74. The feedback loop of driver 70 is now interrupted and the driver is unlatched to return to its de-energized or zero output condition.

Again only the front of the timing pulse traveling in the delay line is required to couple gating pulses through the strip line directional couplers. When the rear or trailing edge of pulse 71 passes each coupler, a negative pulse is also coupled to the inputs of AND gates 62, but this negative pulse is ineffective because of the monopolar characteristic of the AND gates. When the trailing edge reaches inverter 84, the output of the inverter returns to its normal positive potential which conditions the lower input of AND gate 74 to await the arrival of the timing pulse in the next pulse train.

FIGURE 2 shows in greater detail a strip line directional coupler of the type used in the sending and receiving stations of FIGURE 1.

Delay lines 36 and 80 are each actually a strip conductor 100 plated on a suitable substrate (not shown). The transmission line characteristic impedance of the delay line strip is 50 ohms. Each of the directional couplers is another strip conductor 102 which is terminated in a 50-ohm resistor 104 in order to match the characteristic impedance of the transmission strip line 100. In order to maintain essentially constant impedance along the length of transmission line 100, the width of the transmission line is reduced opposite each strip coupler 102 to eliminate or reduce impedance mismatches which would otherwise occur and which are unavoidable in conventional tapped delay lines. A positive-going wave front 108 traveling along strip delay line 100 in the direction indicated transfers energy to the strip line directional coupler 102 to produce a coupled output pulse 109 traveling in the direction indicated on the leg 110 of the coupler. Input pulses traveling in the opposite direction in line 100 will be dissipated in the terminating resistor 104 and not produce a coupled output pulse.

The length *l* of the coupler 102 in a typical case for coupling a two-nanosecond pulse, for example, is 7.750 inches and a typical spacing S between delay line 100 and coupler 102 is .028 inch. The normal width $W_1$ of the strip delay line 100 is .094 inch.

With such an arrangement, the timing or driving pulse traveling along the transmission strip line is not critical with respect to its width since only the positive-going wave front is used. Likewise, deterioration of the front is minimized since it is always traveling in a constant impedance line. Constant impedance is maintained by reducing the width of the transmission line strip 100 slightly in the area of the coupler as indicated by $W_2$. However, since some energy is withdrawn from the traveling wave front as it passes each strip line directional coupler, the energy level of the pulse front will be reduced slightly as it travels toward the end of the line. Consequently, it is desirable to loosely couple the couplers at the beginning of the delay line and tighten up the coupling of the couplers near the end of the transmission line. Such a result is easily obtained by increasing the space S separating the delay line and coupler strips for loose coupling and decreasing the space for tighter coupling.

Another advantage of such a system is that only the front of the timing pulse in a delay line is required and the only limitation on the timing pulse width is that it be wider than the desired width of the coupled pulse. Since only the wave front is required, a very high repetition rate can be achieved with a relatively wide timing pulse. Furthermore, the capability of matching the delay line impedance at each coupler reduces reflections which are found in other delay line systems utilizing physical, electrical connections to the delay line at tap-off points.

Both the pulse repetition rate and the pulse width of the coupled or converted pulses can be easily controlled by such an arrangement. Repetition rate of the pulses generated at the sending station is controlled by the spacing between the directional couplers along the length of the delay line. The spacing of the couplers at the receiving station is adjusted to accommodate the repetition rate of the received pulses. The pulse width of the coupled pulses is controlled by the length of each of the strip line directional couplers. In addition, as the system speed increases, the physical length of the delay line and the coupling strips become shorter.

While there have been shown and described and pointed out the fundamental novel features of the invention as applied to a preferred embodiment, it will be understood that various omissions and substitutions and changes in the form and detail of the device illustrated and in its operation may be made by those skilled in the art without departing from the spirit of the invention. It is the intention therefore to be limited only as indicated by the scope of the following claims.

What is claimed is:

1. Apparatus for converting parallel coded signals to serially coded signals comprising:

(a) a first high frequency transmission delay line, (b) signal gating means, (c) a plurality of first strip line directional couplers spaced along the length of said delay line but physically spaced therefrom, (d) means connecting the output of each of said first couplers to said gating means, (e) means for applying coded signals in parallel to said gating means, (f) a plurality of second strip line directional couplers spaced along the length of said delay line and physically separated therefrom, (g) means connecting the output of each of said second couplers to said gating means, said second couplers being oriented oppositely to said first couplers with respect to the length of said delay line, and (h) means for applying first and second timing signals to opposite ends of said delay line whereby said first timing signal traveling along said delay line in one direction will be coupled only through said first couplers to said gating means and said second timing signal traveling along said delay line in the opposite direction will be coupled only through said second couplers to said gating means.

2. Apparatus for converting parallel coded signals to serially coded signals as defined in claim 1 wherein said gating means comprises:

(a) a plurality of first gating circuits each connected to the output of a different one of said first couplers, and (b) a plurality of second gating circuits each connected to a different one of said second couplers, whereby said first timing signal is coupled only to said first gating circuits and said second timing signal is coupled only to said second gating circuits.

3. Apparatus as defined in claim 2 in combination with means for converting said serially coded pulses to parallel coded pulses, said last mentioned means comprising:

(a) a second high frequency transmission delay line, (b) a plurality of third strip line directional couplers spaced along the length of said second delay line but physically spaced therefrom, (c) a plurality of third gating circuits, (d) means connecting the output of each of said third couplers to a different one of said third gating circuits, (e) means for applying said serially coded pulses to said third gating circuits, and (f) means applying a third timing signal to said second delay line, whereby as said timing signal passes said third couplers, gating pulses are sequentially coupled to said connecting means sequentially to pass said serially coded pulses through said third gating circuits to produce parallel coded pulses at the outputs thereof.

References Cited

UNITED STATES PATENTS 2,790,160 4/1957 Millership ---------- 340—174

OTHER REFERENCES

Wild et al. (I), Handbook of Tri-plate Microwave Components, Sanders Associates, Nashua, N.H., 1956 (pp. 80–82 relied on) (copy in group 250).

Wild et al. (II), ibid. (pp. 19–27 relied on).

MAYNARD R. WILBUR, *Primary Examiner.*

G. R. EDWARDS, *Assistant Examiner.*

U.S. Cl. X.R.

333—30